United States Patent
Yang et al.

(10) Patent No.: US 8,995,178 B1
(45) Date of Patent: Mar. 31, 2015

(54) SRAM WITH EMBEDDED ROM

(71) Applicants: Jianan Yang, Austin, TX (US); Brad J. Garni, Austin, TX (US); Mark W. Jetton, Austin, TX (US)

(72) Inventors: Jianan Yang, Austin, TX (US); Brad J. Garni, Austin, TX (US); Mark W. Jetton, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/069,192

(22) Filed: Oct. 31, 2013

(51) Int. Cl.
*G11C 11/00* (2006.01)
*G11C 11/412* (2006.01)
*H01L 27/11* (2006.01)

(52) U.S. Cl.
CPC .......... *G11C 11/412* (2013.01); *H01L 27/1104* (2013.01)
USPC .......................................... 365/156; 365/205

(58) Field of Classification Search
CPC ........................... G11C 11/412; G11C 11/4091
USPC ................................................ 365/156, 205
See application file for complete search history.

(56) References Cited

U.S. PATENT DOCUMENTS

| | | | |
|---|---|---|---|
| 6,041,008 A | 3/2000 | Marr | |
| 6,081,004 A | 6/2000 | Wong et al. | |
| 6,134,137 A | 10/2000 | Kurth et al. | |
| 6,529,400 B1 * | 3/2003 | Bhavnagarwala et al. | ... 365/154 |
| 7,190,610 B2 * | 3/2007 | Porter et al. | .................. 365/156 |
| 7,729,170 B2 * | 6/2010 | Tanuma et al. | .......... 365/185.14 |
| 8,625,333 B2 * | 1/2014 | Rao et al. | ...................... 365/154 |
| 8,675,397 B2 * | 3/2014 | Liaw | ............................. 365/154 |

OTHER PUBLICATIONS

Roy, K, "Rom Embedded Cache: Almost Zero Area-Overhead Accelerator", White Paper Submitted to Semiconductor Research Corporation, Jan. 25, 2012, pp. 1-2.

* cited by examiner

*Primary Examiner* — Michael Tran
(74) *Attorney, Agent, or Firm* — Mary Jo Bertani

(57) ABSTRACT

An integrated circuit includes first and second memory cells including a first pull-up transistor each having a body tie coupled to respective first and second well bias voltages. Drain electrodes of the first and second pull-up transistors are coupled to a first true bit line and a first complementary bit line, respectively. A second memory cell includes first and second pull-up transistors each having a body tie coupled to the second and first well bias voltages, respectively. Drain electrodes of the first and second pull-up transistors are coupled to a second true bit line and a second complementary bit line, respectively. The first well bias voltage is lower than the second well bias voltage during a Read-Only Memory (ROM) mode, and the first well bias voltage is the same as the second well bias voltage during a Static Random Access Memory (SRAM) mode.

20 Claims, 6 Drawing Sheets

SRAM WITH EMBEDDED ROM

BACKGROUND

Field

This disclosure relates generally to semiconductor devices, and more specifically, to static random access memory (SRAM) with embedded read-only memory (ROM).

Related Art

Processing systems can include one or more types of memory modules, such as static random access memory (SRAM) and read only memory (ROM), along with processors, peripheral circuits and buses. The components may be implemented on the same integrated circuit die or on two or more different die. If the memory modules and the processing components are on the same IC die, the memory modules and processing components are typically implemented using independent circuitry for each device that requires dedicated area on the IC die. If the components are implemented on two or more different die, each die requires space in the device that uses the components. With demand for ever-decreasing size of devices, it is desirable to use available space efficiently.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and devices for static random access memory (SRAM) with embedded read-only memory (ROM) are disclosed that allow a memory cell to be used as a ROM cell or SRAM cell depending on whether the well of transistors are biased or not. When the array of SRAM cells is powered up in ROM mode, the N-wells of the cells are biased and data stored in the embedded ROM can be read using SRAM peripheral circuitry. When the ROM mode is disabled, the memory cells operate as a conventional SRAM array. The SRAM and the ROM share the same peripheral circuitry, reducing the amount of area required to implement the SRAM/ROM circuitry compared to dedicated circuitry for both the SRAM and ROM. Further, no additional routing metal is required in the memory cells to achieve the desired functionality. This is better understood by reference to the following description and the drawings.

Figure 1:
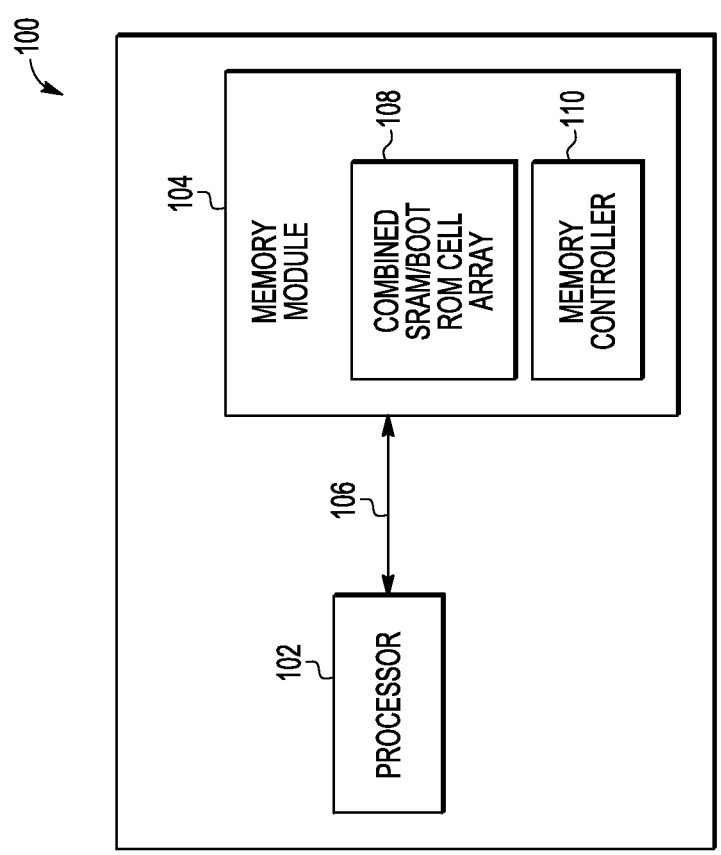
FIG. 1 is a block diagram of an embodiment of a processing system.

FIG. 1 illustrates a block diagram of an embodiment of a processing system 100 in accordance with the present disclosure that includes one or more processors 102 and memory modules 104 coupled to communicate with one another via interconnect or bus 106. Memory module 104 includes a combined static random access memory (SRAM) and Read Only Memory (ROM) memory cell array 108 and memory controller 110. Static random access memory (SRAM) cells can be used in applications requiring high speed, such as cache memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. SRAM cells can be dynamically written and read many times during operation. ROM cells, in contrast, are used to store non-volatile data and/or instructions such as the initial program that runs when the processing system 100 is powered on or otherwise begins execution (a process known as "booting up").

Processing system 100 is an information handling system which can be designed to give independent computing power to one or more users. Processing system 100 may be used in many devices including but not limited to mainframes, minicomputers, servers, workstations, personal computers, notepads, electronic readers, personal digital assistants, electronic games, automobiles, aircraft, machinery, embedded systems, and cell phones and various other wireless devices. Processing system 100 processes information according to one or more programs and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes or threads to help perform the overall functionality of the parent process.

Processing system 100 can include any number of separate integrated circuits or separate devices interconnected with each other. For example, memory module 104 may be located on a same integrated circuit as processor 102. Additional memory may be located on a separate integrated circuit or located within another peripheral or slave discretely separate from other elements of processing system 100.

Figure 2:
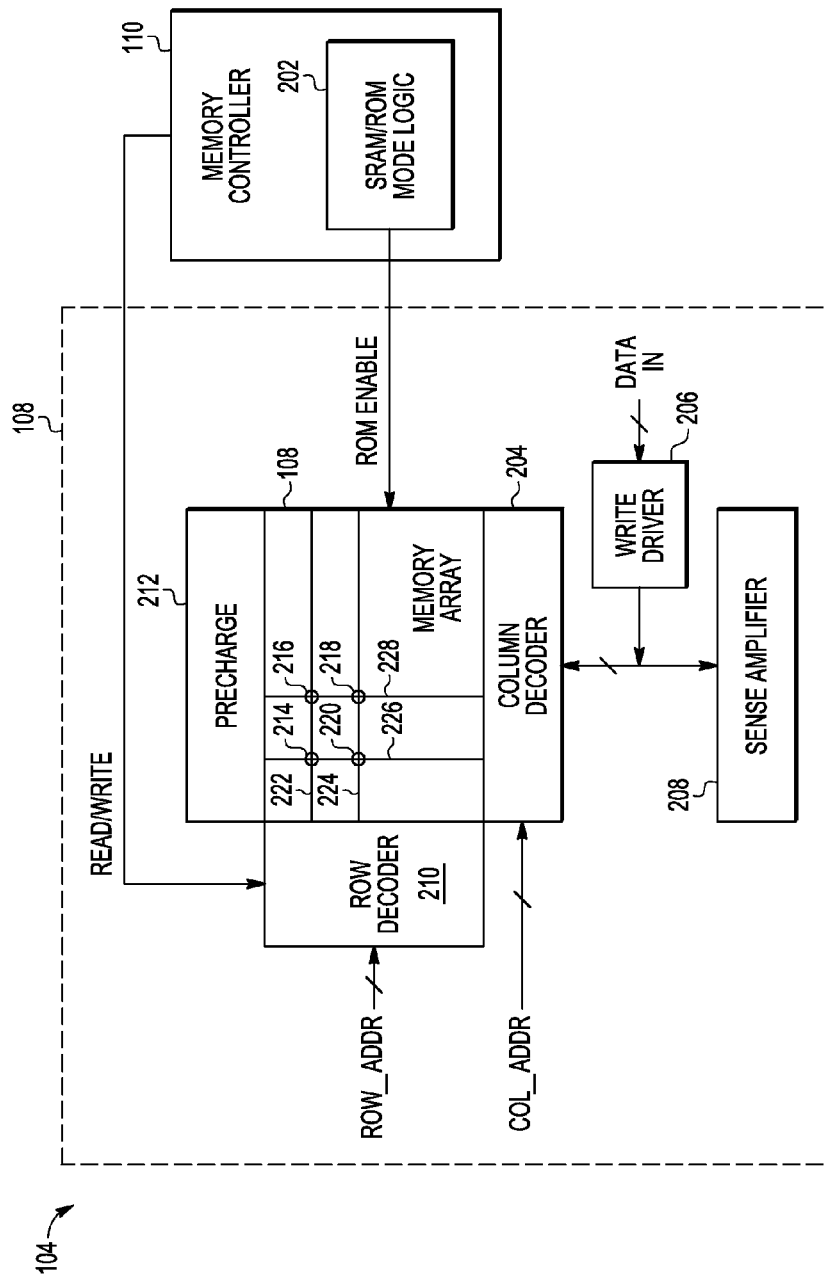
FIG. 2 illustrates an embodiment of a memory module that can be used in the processing system of FIG. 1.

FIG. 2 illustrates an embodiment of memory module 104 that can be used in the processing system 100 of FIG. 1 comprising memory array 108, memory controller 110 including SRAM/ROM mode logic 202 coupled to provide a ROM_ENABLE signal to memory array 212, a row decoder 210 coupled to array 108, a column decoder 204 coupled to array 108, a pre-charge circuit 212 coupled to array 108, a sense amplifier 208 coupled to column decoder 204, and a write driver 206 coupled to column decoder 204. Shown in FIG. 1 in memory array 108 are memory cells 214, 216, 218 and 220, word lines 222 and 224; and bit lines 226 and 228.

Memory cells 214 and 216 are connected to word line 222. Memory cells 220 and 218 are connected to word line 224. Memory cells 214 and 220 are connected to bit line 226. Memory cells 216 and 218 are connected to bit line 228. Bit lines 226 and 228 are a complementary pair of bit lines connected to memory cells along a column. Memory array 108 has many more memory cells located at intersections of many more bit lines and word lines than shown. It is not unusual for a memory array to have hundreds of millions of memory cells.

SRAM/ROM mode logic 202 sets the ROM_ENABLE signal to operate memory cells 214-220 in memory array 212 as either ROM or SRAM memory cells. For example, during fabrication, the ROM cells can be programmed with boot data that is required during power-up mode of system 100. When system 100 is in power-up mode, ROM_ENABLE can be set to use memory cells 214-220 as ROM cells to access the boot data. Memory cells 214-220 can be programmed with other data in addition to or instead of boot data, and operated in ROM mode during other operational modes of system 100. Alternatively, ROM_ENABLE can be set to operate memory cells 214-220 as SRAM cells for cache memory, registers, state machines, and other suitable purposes.

A column address COL_addr is provided to column decoder 204, and a row address ROW_addr is provided to row decoder 210. A word line selected by the row address enables cells along a row and the cells to develop a signal on the bit line or bit lines to which they are connected. Column decoder 204 couples the developed signal to the sense 226 amplifier which senses the developed signal on the selected bit line or bit lines and provides an output, data out of sense amplifier 208, corresponding to the developed signal.

A read/write signal is provided to row decoder 102 by a memory controller 110 or other suitable logic or input. The read/write signal indicates whether a write or a read operation is being performed. Data to be written to memory array 212 is provided to column decoder 204 by write driver 206. Column decoder 204 selects which of the memory cells are to receive or provide data. Note that during a write access to the memory module 104, all of the memory cells coupled to a selected one of word lines are enabled to receive data signals from the bit lines. This is because asserting a word line in the illustrated embodiment disturbs the stored states of all of the memory cells coupled to the word line. The word lines are set depending on which rows are being written.

Figure 3:
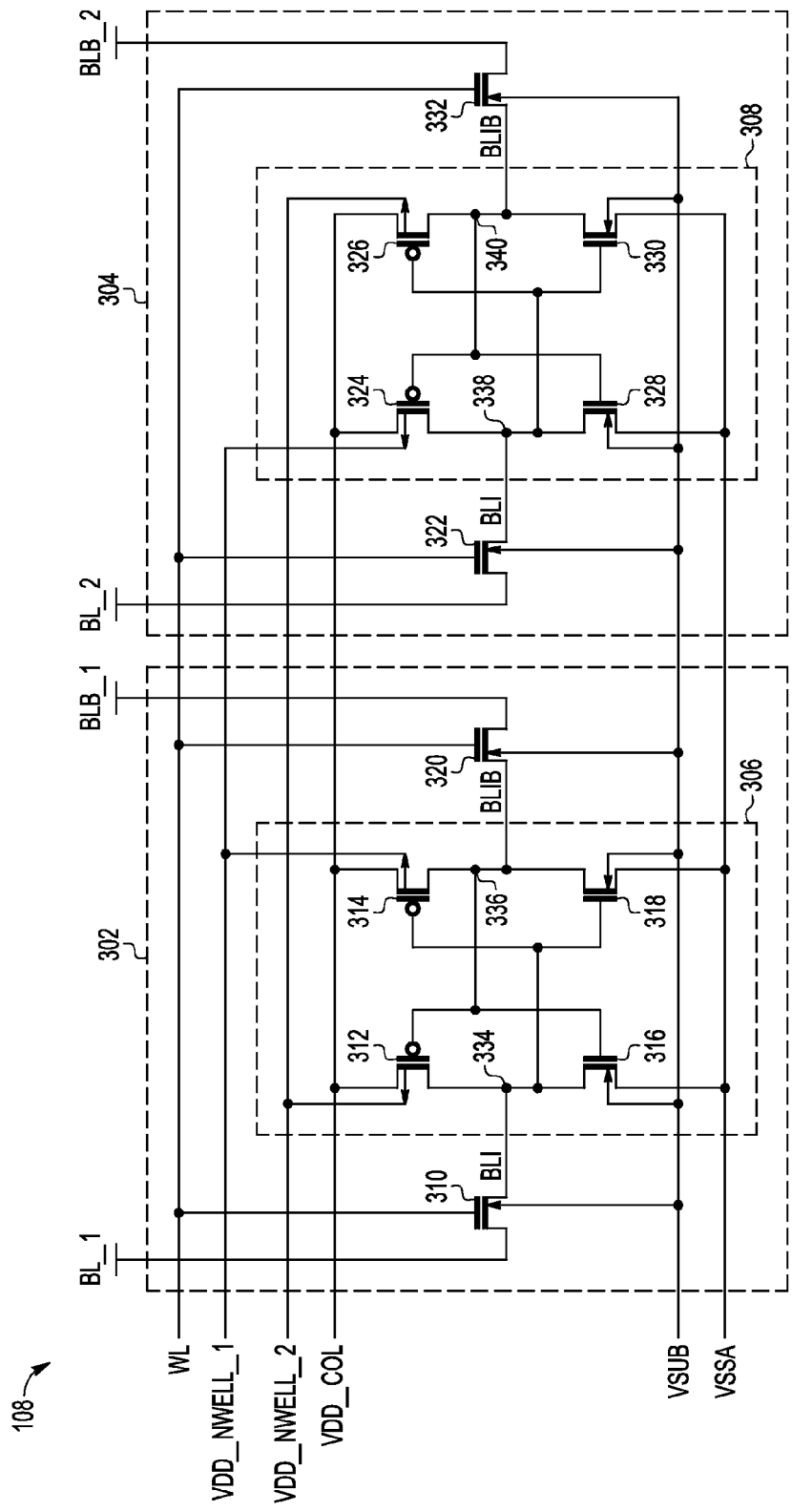
FIG. 3 is a block diagram of an embodiment of static random access memory (SRAM) memory cells with embedded read-only memory (ROM) memory cells that can be used in the memory array of FIG. 2.

FIG. 3 is a block diagram of an embodiment of two static random access memory (SRAM) cells 302, 304 with embedded read-only memory (ROM) that can be used in the memory array 108 of FIG. 1. Memory cells 302, 304 can be implemented in an integrated circuit using CMOS (complementary metal-oxide semiconductor) transistors.

Memory cell 302 includes a pair of cross-coupled inverters 306, one inverter having P-channel pull-up transistor 312 and N-channel pull-down transistor 316, and another inverter having P-channel pull-up transistor 314 and N-channel pull-down transistor 328. Data is retained at storage nodes 334, 336. Memory cell 302 also includes a respective pair of pass transistors 310/320 controlled by a word line (WL) to read or write data on storage nodes 334, 336. P-channel pass transistor 312 has a source electrode connected to a power supply "VDD", a drain electrode connected to storage node 334, a body tie connected to power supply VDD_nwell__2 and a gate electrode connected to a storage node 336. N-channel pull-down transistor 316 has a drain electrode connected to the drain electrode of P-channel pull-up transistor 312, a source electrode connected to first ground power supply VSSA, a body tie connected to second ground power supply VSUB, and a gate electrode connected to storage node 336. In normal operation mode, VSUB and VSSA can have the same value. In a power saving mode, VSUB and VSSA could have different values.

P-channel pull-up transistor 314 has a source electrode connected to VDD, a drain electrode connected to storage node 336, a body tie connected to power supply VDD_nwell__1, and a gate electrode connected to storage node 334. N-channel pull-down transistor 318 has a drain electrode connected to storage node 336, a source electrode connected to power supply VSSA, a body tie connected to power supply VSUB, and a gate electrode connected to storage node 334.

N-channel pass transistor 310 has a drain/source electrode connected to a true bit line labeled "BL__1", a drain/source electrode connected to storage node 334, and a gate electrode connected to word line (WL). N-channel pass transistor 320 has a drain/source electrode connected to storage node 336, a drain/source electrode connected to a complementary bit line BLB__1, and a gate electrode connected to word line WL.

Memory cell 304 includes a pair of cross-coupled inverters 308, one inverter having P-channel pull-up transistor 324 and N-channel pull-down transistor 328, and another inverter having P-channel pull-up transistor 326 and N-channel pull-down transistor 328. Data is retained at storage nodes 338, 340. Memory cell 304 also includes a respective pair of pass transistors 322/332 controlled by a word line (WL) to read or write data on storage nodes 338, 340. P-channel pull-up transistor 324 has a source electrode connected to a power supply "VDD", a drain electrode connected to storage node 338, a body tie connected to power supply VDD_nwell__1 and a gate electrode connected to a storage node 340. N-channel pull-down transistor 328 has a drain electrode connected to the drain electrode of P-channel pull-up transistor 324, a source electrode connected to power supply VSSA, a body tie connected to power supply VSUB, and a gate electrode connected to storage node 340.

P-channel pull-up transistor 326 has a source electrode connected to VDD, a drain electrode connected to storage node 340, a body tie connected to power supply VDD_nwell__2, and a gate electrode connected to storage node 338. N-channel pull-down transistor 330 has a drain electrode connected to storage node 340, a source electrode connected to power supply VSSA, a body tie connected to power supply VSUB, and a gate electrode connected to storage node 338.

N-channel pass transistor 322 has a drain/source electrode connected to a true bit line labeled "BL__2", a drain/source electrode connected to storage node 338, and a gate electrode connected to word line WL. N-channel pass transistor 332 has a drain/source electrode connected to storage node 340, a drain/source electrode connected to a complementary bit line "BLB__2", and a gate electrode connected to word line WL.

Some or all of the memory cells in memory module 104 can have the same structure as memory cells 302, 304 with n-well biasing that causes memory cells 302, 304 to behave as ROM cells when VDD_nwell__1 and VDDnwell__2 have different voltages, memory cells 302, 304 operate as ROM cells, and as SRAM cells when VDD_nwell__1 and VDD_nwell__2 have the same voltage. For example, when VDD_nwell__1 has a higher voltage than VDD_nwell__2, and VDD has reached an "on" voltage, memory cell 302 stores a "1" while memory cell 304 stores a "0". In memory cell 302, PMOS transistor 312 has a lower threshold voltage Vt and higher drive current than PMOS transistor 314 due to the difference in n-well bias voltages VDD_nwell__1 and VDD_nwell__2. The voltage at node 334 will be higher than the voltage at node 336, causing the voltage at node 334 to be pulled to logic "1". In memory cell 304, PMOS transistor 324 has a higher threshold voltage Vt and lower drive current than PMOS transistor 326 due to the difference in n-well bias voltages VDD_nwell_1 and VDD_nwell_2. The voltage at node 338 will be lower than the voltage at node 340, causing the voltage at node 338 to be pulled to logic "0". During fabrication, any number of memory cells 302, 304 can be implemented in memory array 108 in a predetermined order of "1s" and "0s" to program the ROM.

Figure 4:
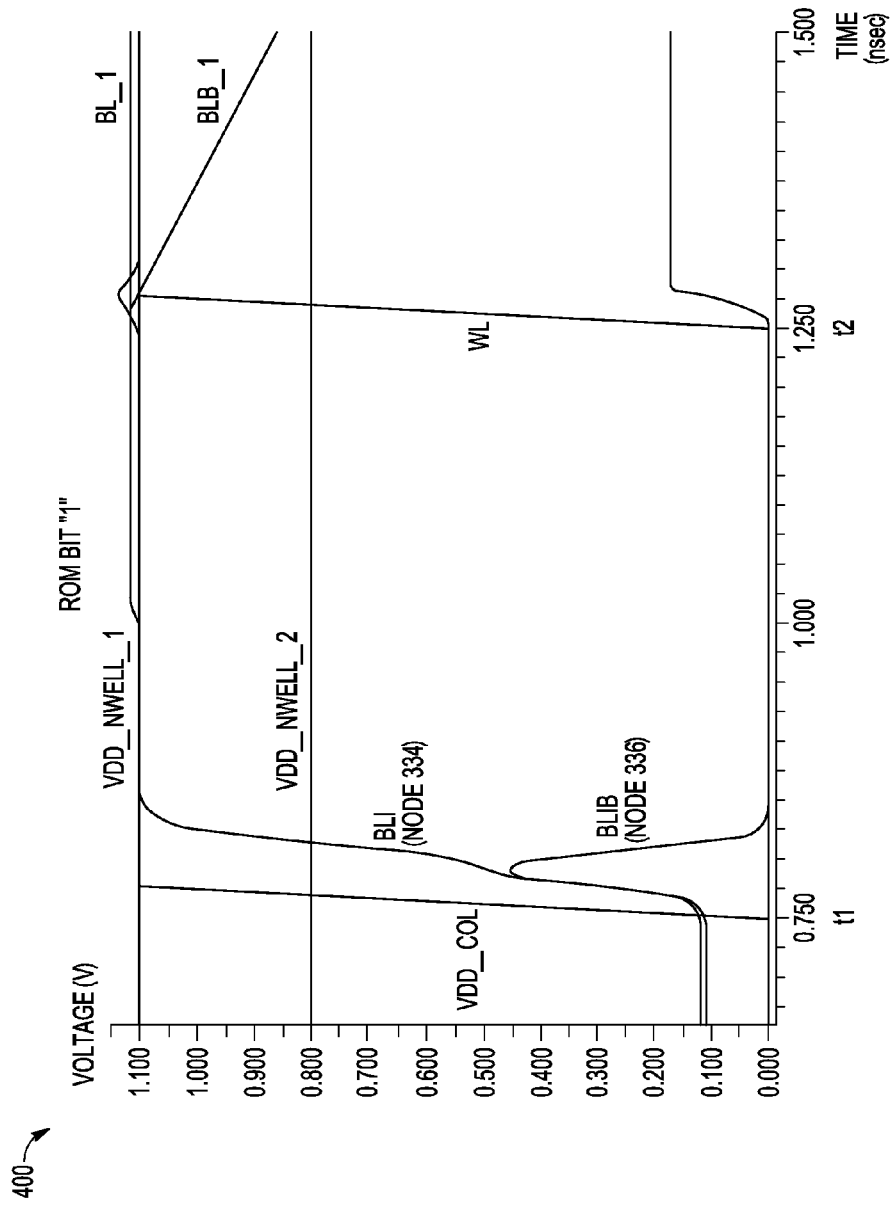
FIG. 4 is a time history diagram showing the value of various signals while operating a memory cell in ROM mode that is programmed at a value of "1" in the combined SRAM/ROM memory array of FIG. 3.

Referring to FIGS. 3 and 4, FIG. 4 is a time history diagram 400 showing the value of various signals while operating memory cell 302 in ROM mode that is programmed at a value of "1" in the combined SRAM/ROM memory array 108 of FIG. 3. The ROM_ENABLE signal (FIG. 2) is set to operate memory array 108 in ROM mode. At time t1, VDD_nwell_1 is at a high voltage level and VDD_nwell_2 is at a voltage level that is less than VDD_nwell_1. In the example shown, the high voltage level is 1.1 Volts and the voltage VDD_nwell_2 is 0.8 Volts, however other suitable voltage levels can be used. VDD is asserted and ramps up to the high voltage. Once VDD is at the high voltage, the voltage at node 334 (BLI) ramps up to the high voltage while the voltage at node 336 (BLIB) initially starts to ramp up along with node 334, but falls off to zero voltage while the voltage at node 334 reaches the high voltage. Once the word line (WL) is asserted, the voltage at node 334 begins to decrease while the voltage at complementary bit line BLB_1 begins to decrease while the voltage at the true bit line (BL_1) remains at the high voltage level. The voltage at node 336 increases from zero Volts to a steady state level, for example, 0.15 Volts or other suitable voltage, when the word line (WL) is asserted.

Figure 5:
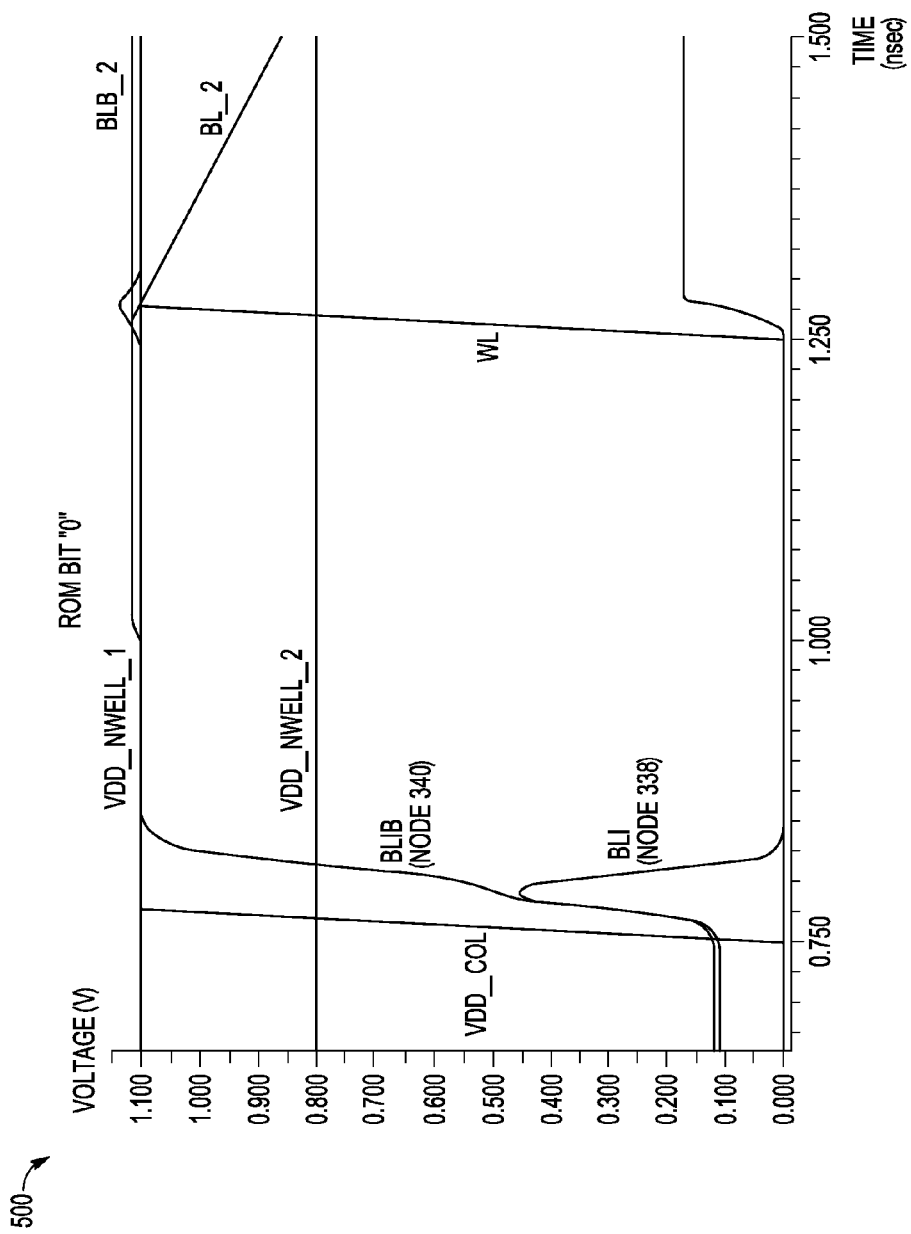
FIG. 5 is a time history diagram showing the value of various signals while operating a memory cell in ROM mode that is programmed at a value of "0" in the combined SRAM/ROM memory array of FIG. 3.

FIG. 5 is a time history diagram 500 showing the value of various signals while operating memory cell 304 in ROM mode that is programmed at a value of "0" in the combined SRAM/ROM memory array 108 of FIG. 3. The ROM_ENABLE signal (FIG. 2) is set to operate memory array 108 in ROM mode. At time t1, VDD_nwell_1 is at a high voltage level and VDD_nwell_2 is at a voltage level that is less than VDD_nwell_1. In the example shown, the high voltage level is 1.1 Volts and the voltage VDD_nwell_2 is 0.8 Volts, however other suitable voltage levels can be used. VDD is asserted and ramps up to the high voltage. Once VDD is at the high voltage, the voltage at node 340 (BLIB) ramps up to the high voltage while the voltage at node 338 (BLI) initially starts to ramp up along with the voltage at node 340, but falls off to zero voltage while the voltage at node 340 reaches the high voltage. Once the word line (WL) is asserted, the voltage at the true bit line BL_2 begins to decrease while the voltage at the complementary bit line (BLB_2) remains at the high voltage level. The voltage at node 338 increases from zero Volts to a steady state level, for example, 0.15 Volts or other suitable voltage, when the word line (WL) is asserted.

Figure 6:
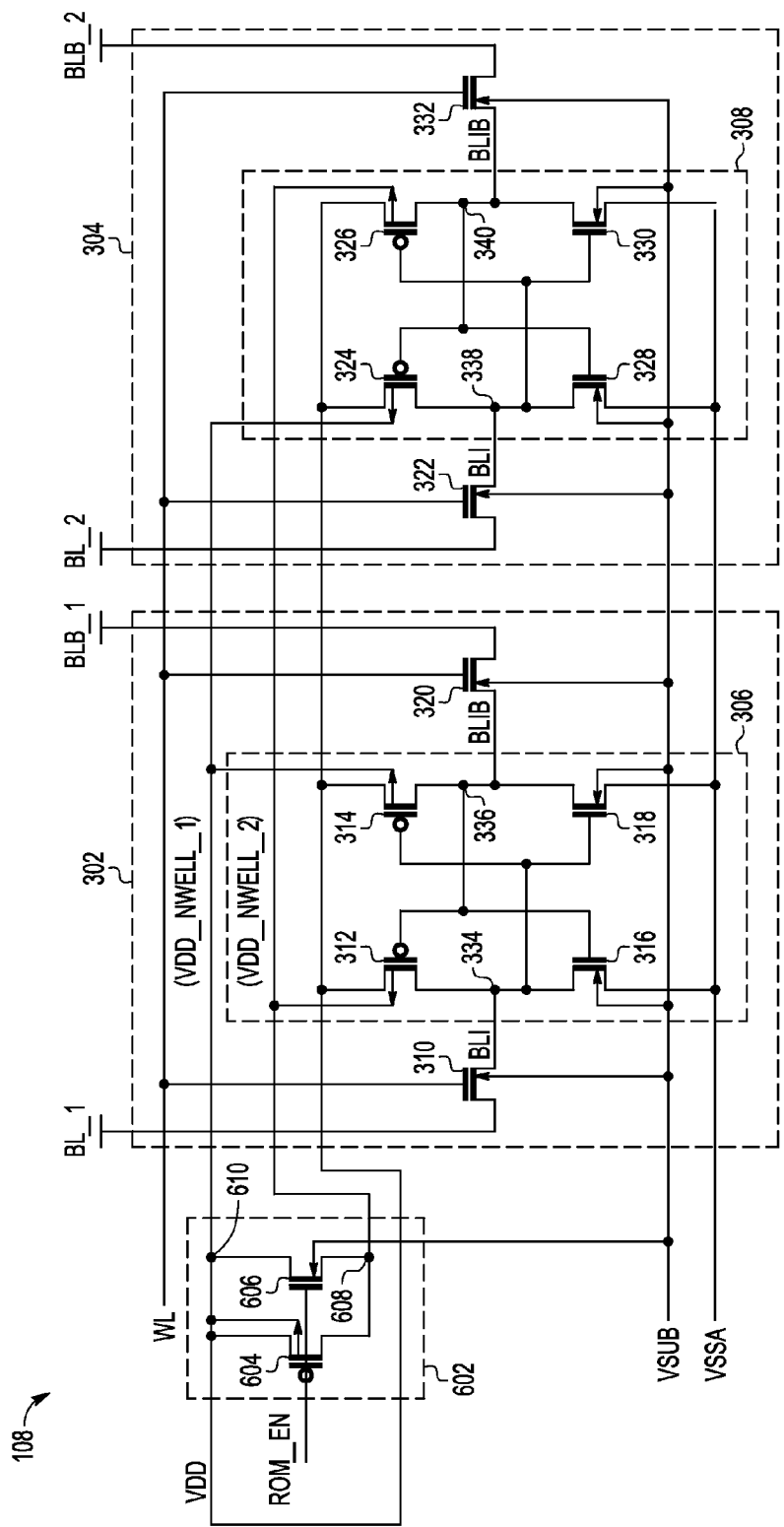
FIG. 6 is a block diagram of another embodiment of a static random access memory (SRAM) cells with embedded read-only memory (ROM) cells that can be used in the memory array of FIG. 2.

FIG. 6 is a block diagram of another embodiment of static random access memory (SRAM) cells 302, 304 with embedded read-only memory (ROM) cells that can be used in the memory array 108 of FIG. 1. The structure and operation of memory cells 302, 304 are the same as shown and described in FIG. 3, however supply circuit 602 has been added that uses a single supply voltage VDD to provide voltages equivalent to VDD_nwell_1 and VDD_nwell_2. Supply circuit 602 includes P-channel transistor 604 coupled in parallel with N-channel transistor 606. The gate electrodes of transistors 606, 604 are coupled to the ROM_ENABLE signal. A source electrode and body tie of P-channel transistor 604 and a drain electrode of N-channel transistor 606 are coupled to VDD. A drain electrode of P-channel transistor 604 and a source electrode and body tie of N-channel transistor 606 are coupled to one another.

During operation when ROM-ENABLE is high or enabled, P-channel transistor 604 is in a non-conductive state while N-channel transistor 606 is in an active state. The voltage at node 608 (the source electrode of N-channel transistor 606) is equal to VDD minus the threshold voltage of N-channel transistor 606. The bias voltage at the body ties of P-channel transistors is 312 and 326 is therefore equal to VDD minus the threshold voltage of N-channel transistor 606, while the bias voltage at the body ties of P-channel transistors 314 and 324 is VDD.

When ROM-ENABLE is low or disabled, N-channel transistor 606 is in a non-conductive state while P-channel transistor 604 is in an active state. The voltage at nodes 608 and 610 is equal to VDD. The bias voltage at the body ties of P-channel transistors is 312, 314, 324 and 326 is therefore equal to VDD and memory cells 302, 304 operate in SRAM mode.

By now it should be appreciated that in some embodiments, an integrated circuit (100) is provided that can include a memory cell array (108) including a first memory cell (302). The first memory cell includes first and second pass transistors (320, 310) that include a gate electrode connected to a word line, a first inverter and a second inverter. The first inverter includes a first pull-up transistor (314) including a source electrode connected to a first voltage source (VDD) and a body tie connected to a first well bias voltage (VDD_nwell_1). An output of the first inverter is coupled to a first complementary bit line (BLB_1) via the first pass transistor (320). A second inverter includes a first pull-up transistor (312) including a source electrode connected to the first voltage source (VDD) and a body tie connected to a second well bias voltage (VDD_nwell_2), the first well bias voltage is greater than the second well bias voltage when a Read-Only Memory (ROM) enable signal is set to a first state. An output of the second inverter is coupled to a first true bit line (BL_1) via the second pass transistor (310).

In another aspect, the integrated circuit can further comprise a second memory cell (304) in the memory array. The second memory cell includes first and second pass transistors (322, 332) that include a gate electrode connected to the word line, a first inverter and a second inverter. The first inverter includes a first pull-up transistor (324) including a source electrode connected to the first voltage source (VDD) and a body tie connected to the first well bias voltage (VDD_nwell_1). An output of the first inverter is coupled to a second true bit line (BL_2) via the first pass transistor (322). The second inverter includes a second pull-up transistor (326) including a source electrode connected to the first voltage source (VDD) and a body tie connected to the second well bias voltage (VDD_nwell_2). An output of the second inverter is coupled to a second complementary bit line (BLB_2) via the second pass transistor (332).

In another aspect, the integrated circuit of claim 1 can further comprise a memory controller (110) configured to provide the ROM enable signal to the memory array.

In another aspect, when the ROM enable signal is in a second state, the second well bias voltage is equal to the first well bias voltage and the first and second memory cells operate in a Static Random Access Memory (SRAM) mode.

In another aspect, the integrated circuit can further comprise processor (102) coupled to the memory module.

In another aspect, the integrated circuit can further comprise a body tie of the first and second pass transistors coupled to a ground voltage (VSUB).

In another aspect, the first memory cell can further comprising a pull-down transistor (316, 318) coupled to the pull-up transistor in the first and second inverters. A body tie of the pull-down transistor is coupled to a first ground (VSUB) and a source electrode of the pull-down transistor is coupled to a second ground (VSSA).

In another aspect, the second memory cell can further comprise a pull-down transistor (328, 330) coupled to the pull-up transistor in the first and second inverters. A body tie of the pull-down transistor is coupled to a first ground (VSUB) and a source electrode of the pull-down transistor is coupled to a second ground (VSSA).

In another aspect, the integrated circuit can further comprise the first memory cell outputs a logic HIGH when the ROM enable signal is in the first state, and the second memory cell outputs a logic LOW when the ROM enable signal is in the first state.

In other embodiments, an integrated circuit can comprise a first memory cell (302) including a first pull-up transistor (312) having a body tie coupled to a first well bias voltage (VDD_nwell_2) and a drain electrode coupled to a first true bit line (BL_1), and a second pull-up transistor (314) having a body tie coupled to a second well bias voltage (VDD_nwell_1) and a drain electrode coupled to a first complementary bit line (BLB_1). A second memory cell (302) can include a first pull-up transistor (324) having a body tie coupled to the second well bias voltage (VDD_nwell_1), a second pull-up transistor with a body tie coupled to the first well bias voltage (VDD_nwell_2), a drain electrode of the first pull-up transistor is coupled to a second true bit line (BL_2) and a drain electrode of the second pull-up transistor is coupled to a second complementary bit line (BLB_2). The first well bias voltage is lower than the second well bias voltage during a Read-Only Memory (ROM) mode. The first well bias voltage is the same as the second well bias voltage during a Static Random Access Memory (SRAM) mode.

In another aspect, the integrated circuit can further comprise a memory controller configured to provide a ROM enable signal that is set to a first state to enable the ROM mode and disable the SRAM mode, and to a second state to enable the SRAM mode and disable the ROM mode.

In another aspect, the first memory cell can further comprise a first pull-down transistor (316) having a drain electrode coupled to the drain electrode of the first pull-up transistor, a source electrode of the first pull-down transistor coupled to a first ground voltage supply (VSSA) and a body tie of the first pull-down transistor coupled to a second ground voltage supply (VSUB). A second pull-down transistor (318) can have a drain electrode coupled to the drain electrode of the second pull-up transistor, a drain electrode of the second pull-down transistor coupled to a first ground voltage supply (VSSA) and a body tie of the second pull-down transistor coupled to a second ground voltage supply (VSUB).

In another aspect, the second memory cell can further comprise a first pull-down transistor (328) having a drain electrode coupled to the drain electrode of the first pull-up transistor, a source electrode of the first pull-down transistor coupled to a first ground voltage supply (VSSA) and a body tie of the first pull-down transistor coupled to a second ground voltage supply (VSUB). A second pull-down transistor (330) can have a drain electrode coupled to the drain electrode of the second pull-up transistor, a source electrode of the second pull-down transistor coupled to a first ground voltage supply (VSSA) and a body tie of the second pull-down transistor coupled to a second ground voltage supply (VSUB).

In another aspect, the integrated circuit can further comprise a source electrode of the first and second pull-up transistors of the first memory cell coupled to a supply voltage (VDD). A source electrode of the first and second pull-up transistors of the second memory cell can be coupled to the supply voltage. The second well bias voltage is equal to the supply voltage during the ROM mode.

In another aspect, the integrated circuit can further comprise the first memory cell outputting a logic HIGH during the ROM mode, and the second memory cell outputs a logic LOW during the ROM mode.

In another aspect, the integrated circuit can further comprise the first ground voltage supply and the second ground voltage supply being at different voltage levels during a low power mode.

In another aspect, the integrated circuit can further comprise, in the first memory cell, a first pass transistor is connected between the drain electrode of the first pull-up transistor and a first true bit line and a second pass transistor is connected between the drain electrode of the second pull-up transistor and a first complementary bit line. A gate electrode of the first and second pass transistors is coupled to a word line. In the second memory cell, a first pass transistor is connected between the drain electrode of the first pull-up transistor and a second true bit line and a second pass transistor is connected between the drain electrode of the second pull-up transistor and a second complementary bit line, a gate electrode of the first and second pass transistors is coupled to the word line.

In still further embodiments, a method can comprise forming a first memory cell (302) in an integrated circuit, the first memory cell including a first pull-up transistor (312) having a body tie coupled to a first well bias voltage (VDD_nwell_2), a second pull-up transistor (314) with a body tie coupled to a second well bias voltage (VDD_nwell_1), a first pass transistor (310) including a gate electrode coupled to a word line, a second pass transistor (320) including a gate electrode coupled to the word line, a drain electrode of the first pull-up transistor coupled to a first true bit line (BL_1) and a drain electrode of the second pull-up transistor coupled to a first complementary bit line (BLB_1). A second memory cell (302) in the integrated circuit is formed including a first pull-up transistor (324) having a body tie coupled to the second well bias voltage (VDD_nwell_1), a second pull-up transistor with a body tie coupled to the first well bias voltage (VDD_nwell_2), a first pass transistor (322) including a gate electrode coupled to the word line, a second pass transistor (332) including a gate electrode coupled to the word line, a drain electrode of the first pull-up transistor coupled to a second true bit line (BL_2) and a drain electrode of the second pull-up transistor coupled to a second complementary bit line (BLB_2). A memory controller is formed coupled to the first and second memory cells in the integrated circuit, the memory controller is operable to control the first well bias voltage to be lower than the second well bias voltage during a Read-Only Memory (ROM) mode, and to control the first well bias voltage to be the same as the second well bias voltage during a Static Random Access Memory (SRAM) mode.

In another aspect, the method can further comprise forming a source electrode of the first and second pull-up transistors of the first memory cell coupled to a supply voltage (VDD), and forming a source electrode of the first and second pull-up transistors of the second memory cell coupled to the supply voltage. The memory controller is further operable to control the second well bias voltage to be equal to the supply voltage during the ROM mode.

In another aspect, the method can further comprise arranging the first and second memory cells to be part of programmed logic to be used during the ROM mode.

Although the disclosure has been described with respect to specific conductivity types or polarity of potentials, skilled artisans appreciated that conductivity types and polarities of potentials may be reversed.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. For example, a top oxide and a bottom oxide were described but another insulating material may be substituted. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit, comprising:
   a memory cell array including a first memory cell, the first memory cell includes:
      first and second pass transistors that include a gate electrode connected to a word line;
      a first inverter including:
         a first pull-up transistor including a source electrode connected to a first voltage source and a body tie connected to a first well bias voltage, and
         an output of the first inverter is coupled to a first complementary bit line via the first pass transistor; and
      a second inverter including:
         a first pull-up transistor including a source electrode connected to the first voltage source and a body tie connected to a second well bias voltage, the first well bias voltage is greater than the second well bias voltage when a Read-Only Memory (ROM) enable signal is set to a first state, and
         an output of the second inverter is coupled to a first true bit line via the second pass transistor.

2. The integrated circuit of claim 1, further comprising:
   a second memory cell in the memory array, the second memory cell includes:
      first and second pass transistors that include a gate electrode connected to the word line,
      a first inverter including
         a first pull-up transistor including a source electrode connected to the first voltage source and a body tie connected to the first well bias voltage, and
         an output of the first inverter is coupled to a second true bit line via the first pass transistor,
      a second inverter including
         a second pull-up transistor including a source electrode connected to the first voltage source and a body tie connected to the second well bias voltage, and
         an output of the second inverter is coupled to a second complementary bit line via the second pass transistor.

3. The integrated circuit of claim 1, further comprising a memory controller configured to provide the ROM enable signal to the memory array.

4. The integrated circuit of claim 1, wherein when the ROM enable signal is in a second state, the second well bias voltage is equal to the first well bias voltage and the first and second memory cells operate in a Static Random Access Memory (SRAM) mode.

5. The integrated circuit of claim 1, further comprising:
   a processor coupled to the memory module.

6. The integrated circuit of claim 5, further comprising:
   a body tie of the first and second pass transistors is coupled to a ground voltage.

7. The integrated circuit of claim 1, the first memory cell further comprising:
   a pull-down transistor coupled to the pull-up transistor in the first and second inverters, a body tie of the pull-down transistor is coupled to a first ground and a source electrode of the pull-down transistor is coupled to a second ground.

8. The integrated circuit of claim 1, the second memory cell further comprising:
   a pull-down transistor coupled to the pull-up transistor in the first and second inverters, a body tie of the pull-down transistor is coupled to a first ground and a source electrode of the pull-down transistor is coupled to a second ground.

9. The integrated circuit of claim 2, further comprising:
   the first memory cell outputs a logic HIGH when the ROM enable signal is in the first state; and
   the second memory cell outputs a logic LOW when the ROM enable signal is in the first state.

10. An integrated circuit, comprising:
    a first memory cell including a first pull-up transistor having a body tie coupled to a first well bias voltage and a drain electrode coupled to a first true bit line, and a second pull-up transistor having a body tie coupled to a second well bias voltage and a drain electrode coupled to a first complementary bit line;
    a second memory cell including a first pull-up transistor having a body tie coupled to the second well bias voltage, a second pull-up transistor with a body tie coupled to the first well bias voltage, a drain electrode of the first pull-up transistor is coupled to a second true bit line and a drain electrode of the second pull-up transistor is coupled to a second complementary bit line;
    the first well bias voltage is lower than the second well bias voltage during a Read-Only Memory (ROM) mode; and
    the first well bias voltage is the same as the second well bias voltage during a Static Random Access Memory (SRAM) mode.

11. The integrated circuit of claim 10, further comprising:
a memory controller configured to provide a ROM enable signal that is set to a first state to enable the ROM mode and disable the SRAM mode, and to a second state to enable the SRAM mode and disable the ROM mode.

12. The integrated circuit of claim 10, the first memory cell further comprising:
a first pull-down transistor having a drain electrode coupled to the drain electrode of the first pull-up transistor, a source electrode of the first pull-down transistor is coupled to a first ground voltage supply and a body tie of the first pull-down transistor is coupled to a second ground voltage supply; and
a second pull-down transistor having a drain electrode coupled to the drain electrode of the second pull-up transistor, a drain electrode of the second pull-down transistor is coupled to a first ground voltage supply and a body tie of the second pull-down transistor is coupled to a second ground voltage supply.

13. The integrated circuit of claim 10, the second memory cell further comprising:
a first pull-down transistor having a drain electrode coupled to the drain electrode of the first pull-up transistor, a source electrode of the first pull-down transistor is coupled to a first ground voltage supply and a body tie of the first pull-down transistor is coupled to a second ground voltage supply; and
a second pull-down transistor having a drain electrode coupled to the drain electrode of the second pull-up transistor, a source electrode of the second pull-down transistor is coupled to a first ground voltage supply and a body tie of the second pull-down transistor is coupled to a second ground voltage supply.

14. The integrated circuit of claim 10, further comprising:
a source electrode of the first and second pull-up transistors of the first memory cell are coupled to a supply voltage;
a source electrode of the first and second pull-up transistors of the second memory cell are coupled to the supply voltage; and
the second well bias voltage is equal to the supply voltage during the ROM mode.

15. The integrated circuit of claim 10, further comprising:
the first memory cell outputs a logic HIGH during the ROM mode; and
the second memory cell outputs a logic LOW during the ROM mode.

16. The integrated circuit of claim 10, further comprising:
the first ground voltage supply and the second ground voltage supply are at different voltage levels during a low power mode.

17. The integrated circuit of claim 10, further comprising:
in the first memory cell, a first pass transistor is connected between the drain electrode of the first pull-up transistor and a first true bit line and a second pass transistor is connected between the drain electrode of the second pull-up transistor and a first complementary bit line, a gate electrode of the first and second pass transistors is coupled to a word line; and
in the second memory cell, a first pass transistor is connected between the drain electrode of the first pull-up transistor and a second true bit line and a second pass transistor is connected between the drain electrode of the second pull-up transistor and a second complementary bit line, a gate electrode of the first and second pass transistors is coupled to the word line.

18. A method comprising:
forming a first memory cell in an integrated circuit, the first memory cell including a first pull-up transistor having a body tie coupled to a first well bias voltage, a second pull-up transistor with a body tie coupled to a second well bias voltage, a first pass transistor including a gate electrode coupled to a word line, a second pass transistor including a gate electrode coupled to the word line, a drain electrode of the first pull-up transistor is coupled to a first true bit line and a drain electrode of the second pull-up transistor is coupled to a first complementary bit line;
forming a second memory cell in the integrated circuit, the second memory cell including a first pull-up transistor having a body tie coupled to the second well bias voltage, a second pull-up transistor with a body tie coupled to the first well bias voltage, a first pass transistor including a gate electrode coupled to the word line, a second pass transistor including a gate electrode coupled to the word line, a drain electrode of the first pull-up transistor is coupled to a second true bit line and a drain electrode of the second pull-up transistor is coupled to a second complementary bit line;
forming a memory controller coupled to the first and second memory cells in the integrated circuit, the memory controller is operable to control the first well bias voltage to be lower than the second well bias voltage during a Read-Only Memory (ROM) mode, and to control the first well bias voltage to be the same as the second well bias voltage during a Static Random Access Memory (SRAM) mode.

19. The method of claim 18, further comprising:
forming a source electrode of the first and second pull-up transistors of the first memory cell coupled to a supply voltage (VDD);
forming a source electrode of the first and second pull-up transistors of the second memory cell coupled to the supply voltage; and
the memory controller is further operable to control the second well bias voltage to be equal to the supply voltage during the ROM mode.

20. The method of claim 18, further comprising:
arranging the first and second memory cells to be part of programmed logic to be used during the ROM mode.

* * * * *